United States Patent [19]

Lindmayer

[11] 4,194,212
[45] Mar. 18, 1980

[54] SEMICRYSTALLINE SILICON ARTICLE AND METHOD OF MAKING SAME

[75] Inventor: Joseph Lindmayer, Bethesda, Md.

[73] Assignee: Solarex Corporation, Rockville, Md.

[21] Appl. No.: 916,545

[22] Filed: Jun. 19, 1978

Related U.S. Application Data

[63] Continuation-in-part of Ser. No. 751,342, Dec. 16, 1976, abandoned, and Ser. No. 751,343, Dec. 16, 1976.

[51] Int. Cl.² ........................................... H01L 27/14
[52] U.S. Cl. ........................................... 357/30; 357/88; 357/20
[58] Field of Search ........................... 357/30, 20, 88

[56] References Cited
U.S. PATENT DOCUMENTS 3,953,876  4/1976  Sirtl ........................................... 357/60

4,062,038  12/1977  Cuomo ........................................... 357/30
4,107,724  8/1978  Ralph ........................................... 357/30

Primary Examiner—Martin H. Edlow
Attorney, Agent, or Firm—Watson, Cole, Grindle & Watson

[57] ABSTRACT

A semicrystalline silicon solar energy cell formed from individual grains of silicon having portions thereof at the light-receiving surface of the cell. An electrical junction is formed at said light-receiving surface and extends across and below that surface and into and between the boundaries of adjoining grains to an extent such that the total junction area substantially exceeds the product of the linear dimensions of the wafer surface but does not extend completely around the boundaries of the silicon grains or to the opposed surface of the wafer.

5 Claims, 3 Drawing Figures

SEMICRYSTALLINE SILICON ARTICLE AND METHOD OF MAKING SAME

This application is a continuation-in-part of my co-pending application Ser. No. 751,342, filed Dec. 16, 1976, now abandoned, and entitled, Method of Producing Semicrystalline Silicon and Product Formed Thereby, and is also a continuation-in-part of my co-pending application Ser. No. 751,343, filed Dec. 16, 1976 and entitled, Method of Purifying Silicon.

The present application relates in general to a semiconductor article formed of silicon. More particularly, it is concerned with a photovoltaic solar energy cell that has been formed from what I prefer to term, semicrystalline silicon, which is silicon in the form of regular or irregular grains having an average mean diameter of at least about 100 microns, and preferably more than one millimeter.

As has been recited in greater detail in my application Ser. No. 751,342, the invention of that application as well as the present invention are concerned with the discovery that is other than single or monocrystalline, which is the conventional host material from which silicon photovoltaic cells are formed. While what has been termed polycrystalline silicon is well-known in the art, and is a general term that refers to many varieties of silicon other than monocrystalline, I have discovered that silicon of a grain size of at least 100 microns, and preferably in the order of millimeters in diameter, is so structured that it may well be used to form a photovoltaic cell. In particular, when such grains are highly ordered so far as their crystallographic structure is concerned, it has been found that most of their defects can be concentrated at the grain boundaries. Other than at the grain boundaries, i.e., in the interiors of the grains, the crystallographic order is far more free of defects, and it has likewise been found that impurities are likewise located at the edges of the grains. Thus, since defects and impurities are concentrated at the grain boundaries, it may be possible to utilize semicrystalline silicon wafers for solar cells when a junction has been created therein in a manner such that the minority carrier of the electron-hole pairs will not be interrupted by those defects and impurities of the semicrystalline silicon grains minimized as much as possible. To this extent, it is advisable to purify the grains, for example, in the manner set forth in my copending application Ser. No. 751,343. However, the present invention is founded on the concept that, where defects and impurities are concentrated at the grain boundaries, a p-n junction can be formed in the grains, themselves. In such a manner that those defects and impurities will, if not removed, at least be largely avoided.

It is, therefore, a primary object of the present invention to provide a silicon solar energy cell in which the silicon is semicrystalline silicon, i.e., silicon having at one surface of the wafer an average mean diameter of at least about 100 microns. It is another object of the invention to form such a photovoltaic cell in which the efficiency of production of energy from that cell will be quite satisfactory and, although perhaps not the precise equal of a cell that might be produced under comparable circumstances from monocrystalline silicon, will be such that the efficiency-to-expense ratio will be markedly superior to that for monocrystalline silicon solar energy cells.

In essence, the present invention contemplates a photovoltaic solar energy cell in the form of a silicon wafer having the usual opposed major surfaces, one adapted for the impingement of light thereon, the other forming a back contact. At least at the front, light-impinging surface of the wafer, grains of semicrystalline silicon are provided having a mean diameter preferably in the order of millimeters and grain boundaries of adjoining grains. Most importantly, a photovoltaic junction is formed inwardly of that impingement surface and extends across and below the surface and also into the interior of the individual grains to a depth at which many of the defects and impurities that are concentrated in the grain boundaries are located outside the junction. Further, the junction penetrates the light-impinging surface to an extent whereby the product of the linear dimensions of the wafer surface is exceeded by the total area of the junction. However, the junction does not extend from one surface of the wafer to the other surface, nor does it extend completely around the boundaries of the silicon grains.

As stated, the basic mode of operation by means of which the present invention is found operable is to impress a junction between the boundaries of adjoining grains to an extent that the junction will extend vertically inwardly and perhaps partially around those grains, though not fully around the grains. Indeed, the junctions may extend one-eighth to one-quarter, most preferably the latter, or even further from the front surface of the wafer to the back surface. Further, the junction will be so impressed as to penetrate the individual grains to an extent greater than that normally penetrated by a junction, and in this manner, the inwardly extending junction will avoid a large portion of the defects and impurities that are concentrated in grain boundaries of the individual grains. Such penetration can be achieved by an extended diffusion and by a post-diffusion treatment in which the wafers, when subjected to gaseous diffusion, are allowed to remain in the diffusion furnace for a period of time after the flow of diffusion gases has been terminated. In this manner, the junction will be formed at a greater depth than that at which it is normally established. Moreover, it should extend within the outer surface of each individual grain to a depth of perhaps one-tenth of a micron, or at least to a depth that will avoid many of the defects and impurities concentrated in the grain boundaries.

These and other objects, features and advantages of my invention will become more apparent when considered in connection with the accompanying drawing of a preferred embodiment thereof, which drawing forms a part hereof and in which.

Figure 1:
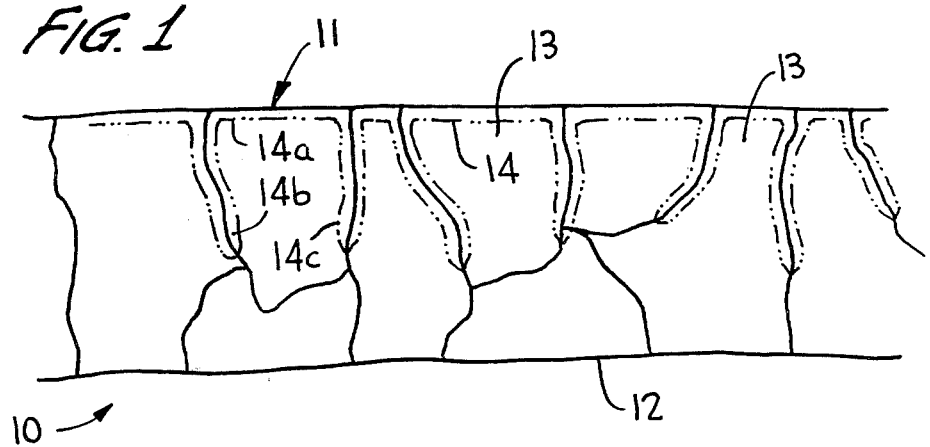
FIG. 1 is a schematic illustration of a preferred embodiment of my invention, showing penetration of the junction between grain boundaries and into the grain surfaces.

Referring now to the drawings, and to FIG. 1 in particular, a silicon solar energy cell is indicated generally by reference numeral 10. The wafer has a front surface 11, which is adapted to receive light impinging thereon, and a back surface 12, which is to receive back contacts that will serve to complete the circuit.

As will be apparent, at least at the front surface 11 of the wafer, the silicon wafer is formed from irregular grains 13 of semicrystalline silicon. Those grains have been produced in accordance with the practice my copending application Ser. Nos. 751,342 and 751,343. With respect to these individual grains 13, they generally abut each other although in wafer form they may have some crevices between them. While the grains not of the purity of monocrystalline silicon they have their impurities and defects concentrated at the grain boundaries. In their interiors, their crystallographic order is satisfactory and after the equal of single crystal silicon.

Indicated by broken line 14 is a front junction formed in the wafer. This junction is a p-n junction, by which is meant to include both a p-n and n-p junction. In the particular example that is generally used to produce semicrystalline solar cells, I have found it most convenient to have the front junction be an n-p junction, beginning with silicon that is doped with one type of conductivity impurity, usually boron, and thereafter diffusing an impurity of the other conductivity type, usually phosphorus into the front surface of the wafer to form the n-p junction. In any case, the junction 14, as shown, extends inwardly along the grain boundaries in some instances at least half of the distance from the front surface 11 to the back surface 12 of the wafer. Further, the junction extends inwardly of each grain boundary to an extent such that it is inward of the zone where the impurities and defects are concentrated. These two features result in a wafer in which several of the problems associated with polycrystalline silicon solar cells have been avoided.

First, the p-n junction as shown in FIG. 1 extends substantially inwardly from the front surface of the wafer. In this manner, it will be apparent that the total junction area has been enlarged, e.g., it is in excess of the surface junction area that is simply the product of the linear dimensions of the front surface of the cell. Moreover, the increased junction area has been evidenced by an increase of five or even ten times the capacitance of the cell over what would be expected for a planar junction. This increased junction area, as well as the fact that the junction extends inwardly, results in easier access of the minority carrier of the electron-hole pairs generated when photons of radiant energy impinge on the front surface 11 and penetrate within the boundaries of the grains 13 that form that surface.

By way of further example, when phosphorus has been diffused into the front surface of a semicrystalline wafer that has been doped with boron, the p-n junction so formed will attract electrons. Consequently, when photons of light enter the interior of a grain 13 of semicrystalline silicon at the surface 11 of the wafer, the electrons of the electron-hole pairs so generated will, on the whole, have a lesser distance to travel to reach the p-n junction. This is because the junction is not limited to a planar area substantially coincident with the surface of the wafer 10; it extends substantially inwardly of the wafer and between adjoining grains 13. It will therefore, be apparent that when an electron is generated near the front surface of the wafer, the electron will travel toward the nearest portion of the p-n junction, which will probably be that portion of the junction near the surface of the grain. That junction portion is generally identified by reference numeral 14a. However, when the electron-hole pairs are generated inwardly of the grain 13 it may well be that the electron of the pair is closer to more inwardly directed portions of the junction 14, e.g., side junction portions 14b or 14c. As a consequence, the fact the junction does extend inwardly will mean that the electrons can move laterally and will have a shorter distance to travel in order to reach the photovoltaic junction formed in the wafer 10. Therefore, there is a greater likelihood that the electrons will reach that junction unimpaired and will not recombine with a hole before reading the p-n junction.

Furthermore, the junction 14 and the exemplary junction portions 14a, 14b and 14c, extend inwardly of the surface of a grain 13. Since defects and impurities, as has been previously stated, are concentrated at the grain boundaries, the fact that the junction 14 does extend inwardly of the grain boundaries will mean that not only does the minority carrier, i.e., the electron or hole have have a shorter distance to travel to reach the junction, but in so traveling it is less likely to contact a defect or an impurity, which contact will result in the loss of energy. Thus, it will be seen that the combination of a junction extending inwardly of the front wafer surface and between the grains, and also inwardly of the boundaries of individual grains results in an avoidance of defects and impurities in the structure of the silicon grains, as well as providing a shorter distance of travel of the minority carrier to the p-n junction. The result is that even with the greater defects and impurities in semicrystalline silicon as compared with that of far more expensive monocrystalline silicon, it is still possible to have a high percentage of the minority carriers successfully reach the p-n junction and, therefore, to obtain relatively high efficiency in a solar cell formed from semicrystalline silicon.

Figure 2:
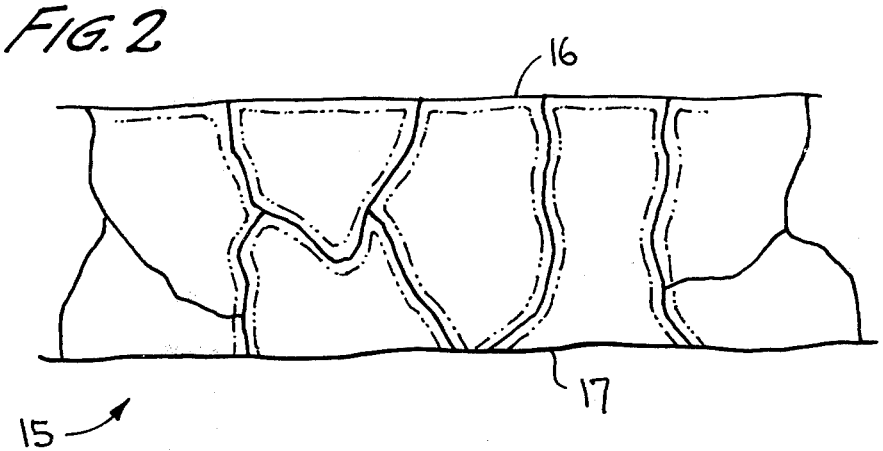
FIG. 2 shows a result that is undesirable, wherein the junction has completely surrounded grains and extends from one surface of the wafer to the other, thereby shunting the wafer.
Figure 3:
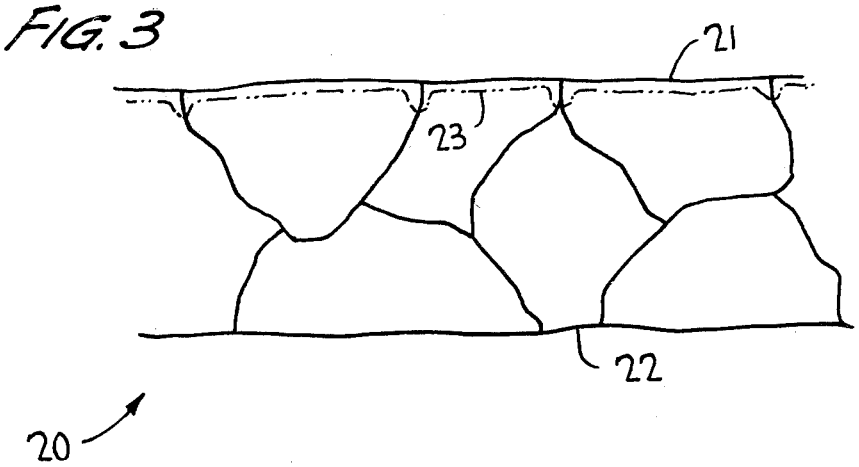
FIG. 3 shows another undesirable result wherein insufficient penetration of the grain boundaries has been achieved by the junction-forming impurity.

FIGS. 2 and 3 have been provided to show structures that should be avoided and that do not fall within the scope of my invention. In FIG. 2, diffusion has taken place to an extent such that the photovoltaic junction completely surrounds certain grains and in others extends from one surface 16 to opposite surface 17 of the wafer 18. In this circumstance, the photovoltaic cell has been shunted and has low efficiency. In FIG. 3, diffusion between the individual grains at the front surface 21 of the wafer 20 has been insufficient. While there is no shorting, e.g., the p-n junction does not extend from the front surface 21 to back surface 22 of the wafer 20, the junction 23 only extends a short distance between adjoining grains of the wafer. While a cell structure such as that shown in FIG. 3 will be operative, and might be satisfactory were the entire wafer formed from monocrystalline silicon, when that wafer is, as at present, formed of semicrystalline silicon, a wafer 20 with a junction 23 will be so inefficient that it is considered not to fall within the scope of the present invention.

With respect to the particular method for producing a silicon solar energy cell formed from semicrystalline silicon substantially as shown in FIG. 1 herein, many of the steps will be apparent to those of ordinary skill in the art. However, it will be formed using semicrystalline silicon in accordance with my application Ser. No. 751,342, preferably as purified in accordance with my application Ser. No. 751,343. Having formed a wafer from this semicrystalline silicon e.g., by slicing, I etch the surface of the wafer with a solution of 36% nitric acid, 21% hydrochloric acid, and 43% acetic acid for 30 seconds. This is a violent etch and the result is a wafer with relatively smooth major surface or surfaces. In particular, the front surface of the wafer, which is adapted to have light impinge thereon, is smooth. The wafer is then rinsed with water and dried.

For the diffusion step, I utilize a mixture of phosphine, helium and oxygen as is also known in the art and which has been disclosed in my U.S. Pat. No. 4,028,151, which is incorporated by reference herein where its disclosure may be requisite. Again, the silicon has been doped with boron prior to crystallization in semicrystalline form. Consequently, I find it most convenient to utilize phosphine as a diffusant of the opposite conductivity type of boron. Diffusion is carried out in a furnace at about 880° C. for about 15 minutes, after which the temperature is gradually allowed to drop to 820° C. over a period of about 20 minutes. After the 15 minutes of diffusion, the phosphine gas is shut off so that the flow over the last 20 minutes continues an atmosphere of helium and oxygen only.

Subsequently, a coating of aluminum about 5,000 Å thick is applied to the back surface of the wafer and the aluminum is alloyed through the glass that has formed on that back surface in accordance with my U.S. Pat. No. 3,990,097, which is specifically incorporated herein by reference where its disclosure is necessary. A contact is then applied to the back surface and a grid-type contact to the front surface in manners that are well-known to those skilled in this art, so that contacts will be established on the front and back surfaces.

The result of practice of this process is a photovoltaic cell formed from semicrystalline silicon that obtains satisfactory, or more than satisfactory efficiency, e.g., 15 percent conversion efficiency of light into electrical energy. Naturally, the process described herein by way of specific example will be subject to considerable variation and yet fall within the scope of my invention. Thus, the prime diffusion may take place at temperatures from about 850° to 900° C. for periods of time varying between about 5 and 20 minutes. Further, the secondary diffusion, during which the diffusant impurity is not present in the atmosphere of the furnace will be carried out for periods of time between 5 minutes and one hour, and the temperature gradient during which the temperature is allowed to drop can vary considerably down to about 800° C. to 850° C. The prime point is that after primary diffusion, the wafer is maintained at a temperature only somewhat less than diffusion temperatures for a period of time that is substantially equal to the time or exceeds the time at which primary diffusion has been carried out. That secondary diffusion, or penetration step is performed in order to drive the diffusant into the interiors of individual grains and between adjoining grains so that the efficiency of the cell subsequently produced will be markedly increased as for example, when a wafer according to FIG. 1 has been produced. Of course, with different thicknesses of wafers and different sizes of grains, as well as different diffusant techniques, the particular conditions necessary to affect the diffusion will vary. Also, when ion implantation is used, it is conceived that wholly different sets of conditions will be utilized.

As a consequence, it is desired that the purview of my invention include the best modes as recited hereinbefore and likewise extend to all obvious modifications, alterations and substitutions therein, which would be known to those of skill in this art after reasonable experimentation. Those alterations, modifications and substitutions are desired to be included within the present invention, which is to be limited in scope only by the following, appended claims.

I claim:

1. A photovoltaic energy cell comprising a silicon wafer having a major surface adapted for the impingement of light thereon and another surface opposed to said impingement surface, said cell and said impingement surface being formed from randomly arranged, irregular, individual grains of silicon having portions thereof at said surface, said grains having mean diameters of at least about 100 microns and grain boundaries that at said impingement surface are in contact with or separated only slightly from the boundaries of adjoining grains, and a photovoltaic junction formed at said impingement surface and extending across and below said surface and also into the interior of said wafer along and inwardly of said grain boundaries, said junction penetrating said wafer to a substantial depth whereby the total junction area exceeds the product of the linear dimensions of said wafer surface but not to an extent whereby said junction extends completely around the boundaries of said silicon grains or from said impingement surface to said opposed surface of said wafer.

2. A photovoltaic energy cell as claimed in claim 1, in which said junction extends around said individual surface grains to the extent of at least one-third of the boundaries thereof.

3. A photovoltaic energy cell as claimed in claim 1, in which said grains have a mean diameter of at least of about one millimeter.

4. A photovoltaic energy cell as claimed in claim 1, in which said junction penetrates said wafer to a depth of at least about 10,000 Å.

5. A photovoltaic energy cell as claimed in claim 1, in which said junction penetrates the boundaries of individual surface grains to an extent whereby said junction is inward of a majority of the impurities of said grains.

6. A method of making a photovoltaic cell from a wafer of semicrystalline silicon having a surface adapted for the impingement of light thereon, said surface being formed from individual grains of silicon having a mean diameter of at least about 100 microns and grain boundaries that at said surface are in contact with or separated only slightly from the boundaries of adjoining grains, and a surface opposed to said impingement surface, comprising in a primary diffusion step, diffusing an impurity into said impingement surface of said wafer and then, in a secondary diffusion step, maintaining said wafer in an atmosphere substantially free from said impurity at a temperature and for a period of time sufficient to cause said impurity to penetrate between said grain boundaries and into said individual grains to form a photovoltaic junction at said impingement surface and extending across and below said surface and also into the interior of said wafer along and inwardly of said grain boundaries, said junction penetrating said wafer to a substantial depth whereby the total junction area exceeds the product of the linear dimensions of said wafer surface but not to an extent whereby said junction extends completely around the boundaries of said silicon grains or from said impingement surface to said opposed surface of said wafer.

7. A method of making a photovoltaic cell as claimed in claim 6, in which said impurity in said primary diffusion step is diffused into said wafer at a temperature of about 850° to 900° C. for about 5 to 20 minutes.

8. A method of making a photovoltaic cell as claimed in claim 6 or claim 7, in which said wafer in said secondary diffusion step is maintained in an atmosphere substantially free from said impurity at a temperature of about 800° to 850° C. for about 5 minutes to one hour.

* * * * *